United States Patent
Park et al.

(10) Patent No.: US 9,405,145 B2
(45) Date of Patent: Aug. 2, 2016

(54) THIN FILM TRANSISTOR ARRAY PANEL FOR A DISPLAY AND MANUFACTURING METHOD THEREOF

(71) Applicant: SAMSUNG DISPLAY CO., LTD., Yongin, Gyeonggi-Do (KR)

(72) Inventors: Je Hyeong Park, Hwaseong-Si (KR); Su Wan Woo, Osan-Si (KR); Kyung Seop Kim, Hwaseong-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/174,440

(22) Filed: Feb. 6, 2014

(65) Prior Publication Data

US 2015/0062507 A1   Mar. 5, 2015

(30) Foreign Application Priority Data

Sep. 5, 2013   (KR) .................. 10-2013-0106748

(51) Int. Cl.
| | | |
|---|---|---|
| *G02F 1/1335* | (2006.01) | |
| *G02F 1/1362* | (2006.01) | |
| *G02F 1/1343* | (2006.01) | |
| *H01L 27/12* | (2006.01) | |

(52) U.S. Cl.
CPC ...... *G02F 1/133512* (2013.01); *G02F 1/13439* (2013.01); *G02F 1/136209* (2013.01); *G02F 2001/136218* (2013.01); *G02F 2001/136222* (2013.01); *H01L 27/124* (2013.01); *Y10T 29/49155* (2015.01)

(58) Field of Classification Search
CPC .................... G02F 1/133512; G02F 1/133514; G02F 1/13439; G02F 1/136209; G02F 2001/136218; G02F 2001/136222; H01L 27/124; Y10T 29/49155

See application file for complete search history.

(56) References Cited

U.S. PATENT DOCUMENTS

| 5,592,317 | A  | * | 1/1997 | Fujikawa et al. ............. | 349/110 |
|---|---|---|---|---|---|
| 7,768,612 | B2 | | 8/2010 | Hirota | |
| 7,821,613 | B2 | | 10/2010 | Kimura | |
| 8,035,784 | B2 | | 10/2011 | Tashiro et al. | |
| 2005/0064205 | A1 | * | 3/2005 | Sawada et al. ............... | 428/432 |
| 2005/0270446 | A1 | * | 12/2005 | Kim et al. .................... | 349/110 |
| 2007/0002199 | A1 | * | 1/2007 | Fujikawa et al. ............. | 349/43 |
| 2008/0136992 | A1 | * | 6/2008 | Kim ................. | G02F 1/133514 349/48 |
| 2010/0140613 | A1 | * | 6/2010 | Kimura ........................... | 257/43 |
| 2010/0245733 | A1 | * | 9/2010 | Ono ............................ | 349/106 |
| 2011/0122357 | A1 | * | 5/2011 | Chang et al. .................. | 349/155 |
| 2012/0147287 | A1 | | 6/2012 | Fujioka | |

FOREIGN PATENT DOCUMENTS

| JP | 09-026603 | 1/1997 |
|---|---|---|
| KR | 10-2008-0059870 | 7/2008 |
| KR | 10-1018558 B1 | 2/2011 |

* cited by examiner

*Primary Examiner* — Dennis Y Kim
(74) *Attorney, Agent, or Firm* — F. Chau & Associates, LLC

(57) ABSTRACT

A thin film transistor array panel includes a substrate. A data line is formed on the substrate. A color filter covers at least a portion of the data line. A shielding electrode is formed on the color filter and is disposed over the data line. A pixel electrode is formed on the color filter and is separated from the shielding electrode. The shielding electrode has a low reflection characteristic.

15 Claims, 7 Drawing Sheets

THIN FILM TRANSISTOR ARRAY PANEL FOR A DISPLAY AND MANUFACTURING METHOD THEREOF

CROSS-REFERENCE TO RELATED APPLICATION

This application claims priority to Korean Patent Application No. 10-2013-0106748 filed in the Korean Intellectual Property Office on Sep. 5, 2013, the disclosure of which is incorporated by reference herein in its entirety.

TECHNICAL FIELD

The present invention relates to a thin film transistor array panel for a display device and a manufacturing method of a display panel.

DISCUSSION OF THE RELATED ART

A liquid crystal display includes two panels. One of the panels may include gate lines, data lines, pixel electrodes, and thin film transistors, and the other may include a common electrode, color filters, and light blocking members. Such display structure may not provide the best aperture ratio.

SUMMARY

According to an exemplary embodiment of the present invention, a thin film transistor array panel according to an exemplary embodiment of the present invention includes a substrate. A data line is formed on the substrate. A color filter covers at least a portion of the data line. A shielding electrode is formed on the color filter and is disposed over the data line. A pixel electrode is formed on the color filter and is separated from the shielding electrode. The shielding electrode has a low reflection characteristic.

The shielding electrode may include a copper (Cu) layer, an indium zinc oxide (IZO) layer, and a titanium (Ti) layer that are formed one over another.

The shielding electrode may include a HASTELLOY® alloy. HASTELLOY is a registered trademark of Haynes International, Inc.

A reflectivity of the shielding electrode may be in a range from about 5 to about 10%.

The indium zinc oxide (IZO) layer may be replaced with a transparent conductive material including zinc oxide (ZnO), gallium zinc oxide (GZO), zinc indium oxide (ZIO), or zinc aluminum oxide (ZAO).

A thickness of the titanium layer may be in a range from about 70 Å to about 200 Å.

A thickness of the indium zinc oxide layer may be in a range from about 400 Å to about 1000 Å.

A thickness of the copper layer may be in a range from about 500 Å to about 1000 Å.

According to an exemplary embodiment of the present invention, a method of manufacturing a display panel according to an exemplary embodiment of the present invention includes sequentially depositing a copper layer on a substrate, an indium zinc oxide layer on the copper layer, and a titanium layer on the indium zinc oxide layer. The deposited copper, indium zinc oxide, and titanium layer are etched, forming a shielding electrode. A transparent conductive material is formed on the substrate including the shielding electrode. The transparent conductive material is etched, forming a pixel electrode separated from the shielding electrode and removing the transparent conductive material formed on the shielding electrode.

The indium zinc oxide (IZO) layer may be replaced with a transparent conductive material including zinc oxide (ZnO), gallium zinc oxide (GZO), zinc indium oxide (ZIO), or zinc aluminum oxide (ZAO).

Etching the shielding electrode may include using a titanium etchant or a copper etchant.

A thickness of the copper layer may be in a range from about 500 Å to about 1000 Å.

A thickness of the indium zinc oxide layer may be in a range from about 400 Å to about 1000 Å.

A thickness of the titanium layer may be in a range from about 70 Å to about 200 Å.

According to an exemplary embodiment of the present invention, a display panel comprises a substrate. A data line is formed on the substrate. A color filter covers at least a portion of the data line. A shielding electrode is formed on the color filter. The shielding electrode overlaps at least a portion of the data line. A pixel electrode is formed on the color filter and is electrically separated or floats from the shielding electrode.

A common voltage is applied to the shielding electrode. The display panel further comprises an overcoat layer between the color filter and the shielding electrode. The shielding electrode includes a triple-layered structure. The shielding electrode includes three layers that are respectively formed of different materials from each other, the materials having low reflectivity.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
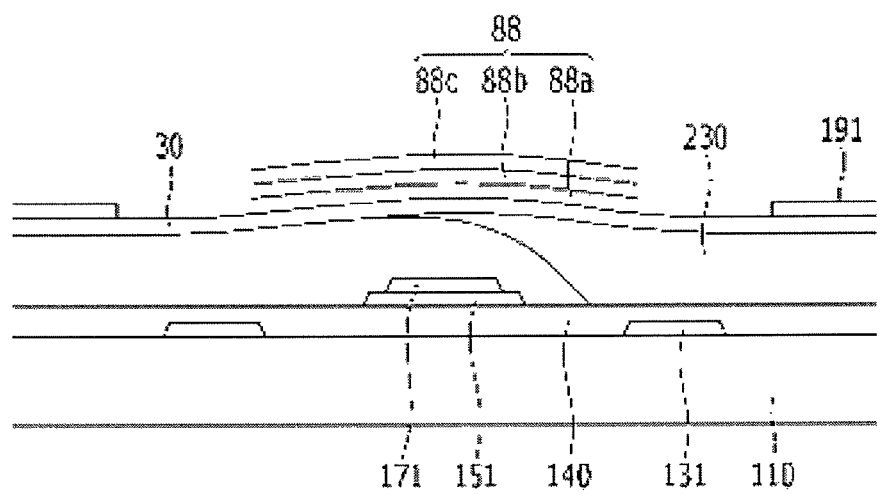
FIG. 1 is a cross-sectional view of a thin film transistor array panel according to an exemplary embodiment of the present invention.

Hereinafter, exemplary embodiments of the present invention will be described in detail with reference to the accompanying drawings. The present invention, however, may be modified in various different ways, and should not be construed as limited to the embodiments set forth herein. Like reference numerals may designate like or similar elements throughout the specification and the drawings. As used herein, the singular forms "a," "an," and "the" are intended to include the plural forms as well, unless the context clearly indicates otherwise. It will be understood that when an element such as a layer, film, region, or substrate is referred to as being "on," "connected to," "coupled to," or "adjacent to"

another element, it can be directly on, connected, coupled, or adjacent to the other element or intervening elements may also be present.

FIG. 1 is a cross-sectional view of a thin film transistor array panel according to an exemplary embodiment of the present invention.

Referring to FIG. 1, a thin film transistor array panel according to an exemplary embodiment includes a gate line (not shown) and a storage electrode 131 formed on an insulation substrate 110. The gate line includes a gate electrode. A gate insulating layer 140 covers the gate line and the storage electrode 131. A semiconductor layer 151, a data line 171, and a drain electrode (not shown) are disposed on the gate insulating layer 140. The semiconductor layer 151 may be disposed under the data line 171 and the drain electrode. The data line 171 includes a source electrode (not shown). The gate electrode, the source electrode, the drain electrode, and a portion of the semiconductor layer 151 form a thin film transistor.

A color filter 230 is disposed on the data line 171 and the gate insulating layer 140. Color filters 230 of different colors are disposed at left and right sides with respect to the data line 171, and the color filters 230 of the different colors overlap each other on the data line 171.

An overcoat layer 30 is disposed on the color filter 230, and a pixel electrode 191 and a shielding electrode 88 are disposed on the overcoat layer 30. The color filter 230 and the overcoat layer 30 may have a contact hole (not shown) exposing the drain electrode, and the pixel electrode 191 is electrically connected to the drain electrode through the contact hole thereby receiving a data voltage.

The shielding electrode 88 is disposed on a portion corresponding to the data line 171, is separated from the pixel electrode 191, and may be electrically floating or may be applied with a predetermined voltage such as a common voltage.

The shielding electrode 88 is formed of a low reflection material having low reflectivity. The low reflection material according to an exemplary embodiment of the present invention may have a triple structure, as shown in FIG. 1. The shielding electrode 88 according to an exemplary embodiment of the present invention includes a first electrode layer 88a, a second electrode layer 88b disposed on the first electrode layer 88a, and a third electrode layer 88c disposed on the second electrode layer 88b.

The first electrode layer 88a may be made of copper (Cu), and a thickness of the first electrode layer 88a may be in a range from about 500 Å to about 1000 Å. When the thickness of the first electrode layer 88a is thinner, light may be transmitted through the first electrode layer 88a, and thus, the first electrode layer 88a cannot function as a light blocking member. The shielding electrode 88 may function as a light blocking member, and thus, a separate light blocking member might not be formed.

The second electrode layer 88b may be made of a transparent conductive material, such as IZO, ZnO, GZO, ZIO, and ZAO, and a thickness of the second electrode layer 88b may be in a range from about 400 Å to about 1000 Å.

The third electrode layer 88c may be made of titanium (Ti), and a thickness of the third electrode layer 88c may be in a range from about 70 Å to about 200 Å. In this thickness range, the titanium layer 88c may have a transflective characteristic.

The shielding electrode 88 has low reflectivity because the second electrode layer 88b and the third electrode layer 88c block light reflected by the first electrode layer 88a that is formed of copper, and thus, a deterioration of a contrast ratio due to the reflection of external light that penetrates into the thin film transistor array panel may be prevented. As such, light coming to the inside of the display panel is blocked by using the shielding electrode 88 in an exemplary embodiment of the present invention, thus preventing a deterioration of the contrast ratio of the display panel and eliminating the need for a light blocking member.

In an exemplary embodiment of the present invention, the shielding electrode 88 includes the first electrode layer 88a, the second electrode layer 88b, and the third electrode layer 88c, however exemplary embodiments of the present invention are not limited thereto. Alternatively, a single layer or a deposition layer having as high reflectivity as the triple-layered shielding electrode may be used. A HASTELLOY® alloy may be included in the single layer or the deposition layer.

Figure 2:
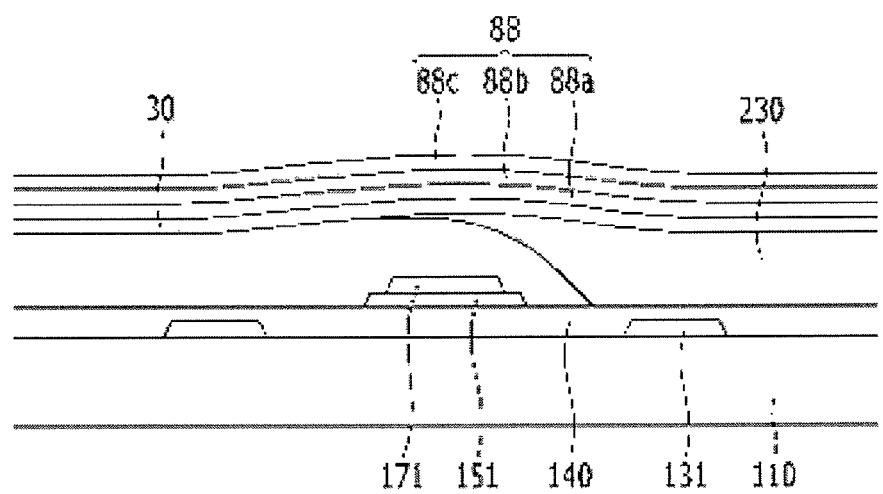
FIG. 2 to FIG. 4 are views showing a process of manufacturing a shielding electrode according to an exemplary embodiment of the present invention.
Figure 3:
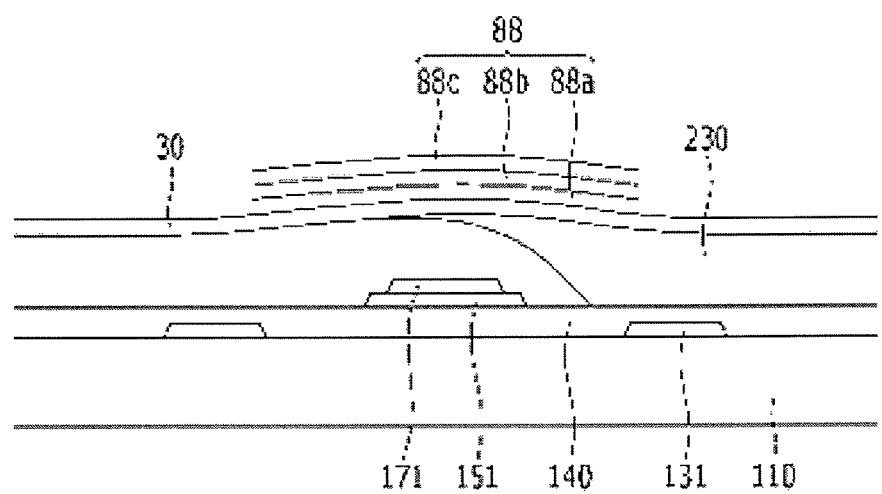
Figure 4:
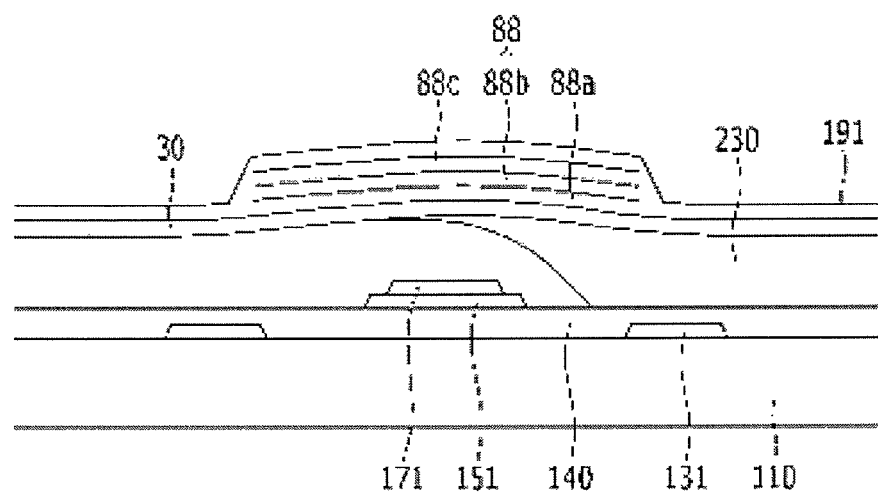

FIG. 2 to FIG. 4 are views sequentially showing a method of manufacturing a shielding electrode according to an exemplary embodiment of the present invention.

Referring to FIG. 2, a gate line (not shown) including a gate electrode and a storage electrode 131 are formed on an insulation substrate 110, and a gate insulating layer 140 covers the gate line and the storage electrode 131. A semiconductor layer 151, a data line 171, and a drain electrode (not shown) are formed on the gate insulating layer 140.

The semiconductor layer 151 is formed under the data line 171 including the source electrode and the drain electrode. The gate electrode, the source electrode, the drain electrode, and the portion of the semiconductor layer 151 form a thin film transistor.

Color filters 230 of different colors are formed at the right and left side with respect to the data line 171 on the gate insulating layer 140 and the data line 171, and the color filters 230 of the different colors overlap each other on the data line 171.

An overcoat layer 30 is formed on the color filter 230. A pixel electrode 191 and a shielding electrode 88 are formed on the overcoat layer 30. The color filter 230 and the overcoat layer 30 may have a contact hole (not shown) exposing the drain electrode. The pixel electrode 191 is electrically connected to the drain electrode and receives a data voltage.

A first metal electrode layer 88a, a second electrode layer 88b, and a third electrode layer 88c are sequentially formed on the overcoat layer 30.

The first electrode layer 88a may be formed of copper (Cu), and the thickness of the first electrode layer 88a may be in a range from about 500 Å to about 1000 Å.

The second electrode layer [[80b]]88b may be formed of a transparent conductive material including IZO, ZnO, GZO, ZIO, and ZAO, and the thickness of the second electrode layer 88b may be in a range from about 400 Å to about 1000 Å.

The third electrode layer 88c may be formed of titanium (Ti), and the thickness of the third electrode layer 88c may be in a range from about 70 Å to about 200 Å.

In an exemplary embodiment of the present invention, the shielding electrode 88 includes the first electrode layer 88a, the second electrode layer 88b, and the third electrode layer 88c. However, exemplary embodiments of the present invention are not limited thereto. Alternatively, a single layer or a deposition layer having as high reflectivity as the shielding electrode of the triple layer may be used. A HASTELLOY® alloy may be included in the single layer or deposition layer.

Referring to FIG. 3, the first electrode layer 88a, the second electrode layer 88b, and the third electrode layer 88c are etched by using an etchant, thus forming the shielding electrode 88. The shielding electrode 88 includes the first electrode layer 88a, the second electrode layer 88b disposed on the first electrode layer 88a, and the third electrode layer 88c disposed on the second electrode layer 88b.

The etchant may be a titanium etchant or a copper etchant.

Referring to FIG. 4, an IZO layer is formed on the shielding electrode 88 and the overcoat layer 30, as shown in FIG. 1. The IZO layer on the shielding electrode 88 and the overcoat layer 30 is etched, forming a pixel electrode 191.

The etching of the IZO layer may be performed by using an IZO etchant.

The titanium etchant or the copper etchant etches the IZO layer. The IZO etchant does not affect the titanium layer and the copper layer, and thus, the shielding electrode 88 is formed and then the pixel electrode 191 is formed.

Figure 5:
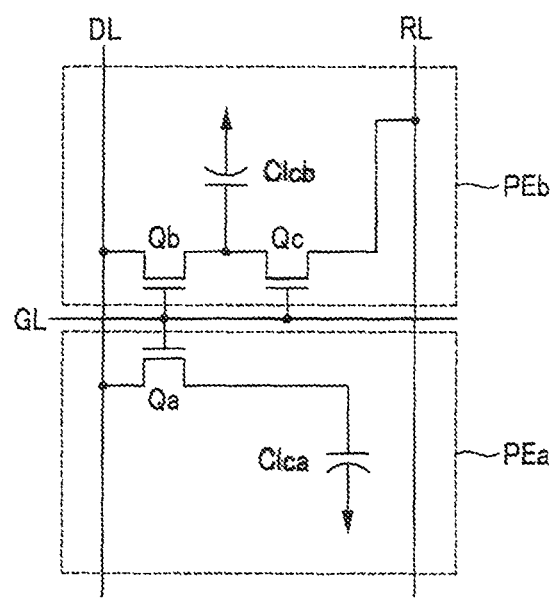
FIG. 5 is an equivalent circuit diagram of one pixel of a liquid crystal display according to an exemplary embodiment of the present invention.

FIG. 5 is an equivalent circuit diagram of one pixel of a liquid crystal display according to an exemplary embodiment of the present invention.

Referring to FIG. 5, one pixel PX of the liquid crystal display according to an exemplary embodiment of the present invention includes a plurality of signal lines including a gate line GL for transferring a gate signal, a data line DL for transferring a data signal, and a storage electrode line RL for transferring a divided reference voltage, first, second, and third switching elements Qa, Qb, and Qc connected to the plurality of signal lines, and first and second liquid crystal capacitors Clca and Clcb.

The first and second switching elements Qa and Qb are connected to the gate line GL and the data line DL, respectively, and the third switching element Qc is connected to an output terminal of the second switching element Qb and the storage electrode line RL.

The first switching element Qa and the second switching element Qb are three-terminal elements such as thin film transistors, and the first and second switching elements Qa and Qb have control terminals connected to the gate line GL and input terminals connected to the data line DL. An output terminal of the first switching element Qa is connected to the first liquid crystal capacitor Clca, and an output terminal of the second switching element Qb is connected to the input terminals of the second liquid crystal capacitor Clcb and the third switching element Qc.

The third switching element Qc may be a three-terminal element such as a thin film transistor, and the third switching element Qc has a control terminal connected to the gate line GL, an input terminal connected to the second liquid crystal capacitor Clcb, and an output terminal connected to the storage electrode line RL.

When a gate-on signal is applied to the gate line GL, the first switching element Qa, the second switching element Qb, and the third switching element Qc which are connected to the gate line GL are turned on. Thus, a data voltage is applied via the data line DL to a first subpixel electrode PEa and a second subpixel electrode PEb through the turned-on first switching element Qa and second switching element Qb. In this case, the data voltages applied to the first subpixel electrode PEa and the second subpixel electrode PEb are the same, and the first liquid crystal capacitor Clca and the second liquid crystal capacitor Clcb are charged with a difference voltage between the common voltage and the data voltage. Substantially simultaneously, the charged voltage in the second liquid crystal capacitor Clcb is divided through the turned-on third switching element Qc. Thus, a charged voltage in the second liquid crystal capacitor Clcb is decreased by a difference between the common voltage and the divided reference voltage. For example, the charged voltage in the first liquid crystal capacitor Clca is higher than the charged voltage in the second liquid crystal capacitor Clcb.

As such, the charged voltage in the first liquid crystal capacitor Clca and the charged voltage in the second liquid crystal capacitor Clcb are different from each other. The voltage of the first liquid crystal capacitor Clca and the voltage of the second liquid crystal capacitor Clcb are different from each other, and thus, the tilting angle of liquid crystal molecules in the first subpixel is rendered different from the tilting angles of liquid crystal molecules in the second subpixel. The luminance of the first subpixel is accordingly rendered different from the luminance of the second subpixel. Accordingly, by controlling the voltage of the first liquid crystal capacitor Clca and the voltage of the second liquid crystal capacitor Clcb, an image viewed from the side of the liquid crystal display may be rendered similar to an image viewed from the front of the liquid crystal display, thus increasing side visibility.

The third switching element Qc is connected to the second liquid crystal capacitor Clcb and the storage electrode line RL, and thus, the voltage charged in the first liquid crystal capacitor Clca is rendered different from the voltage charged in the second liquid crystal capacitor Clcb. Alternatively, the second liquid crystal capacitor Clcb may be connected to a step-down capacitor. For example, the third switching element may include a first terminal connected to a step-down gate line, a second terminal connected to the second liquid crystal capacitor Clcb, and a third terminal connected to the step-down capacitor, and, a portion of the electric charge charged in the second liquid crystal capacitor Clcb may be charged in the step-down capacitor. Accordingly, the voltage charged in the first liquid crystal capacitor Clcb may be rendered different from the voltage charged in the second liquid crystal capacitor Clcb. In an exemplary embodiment of the present invention, the first liquid crystal capacitor Clcb and the second liquid crystal capacitor Clcb may be connected to different data lines, respectively, and receive different data voltages, respectively. Accordingly, the voltage charged in the first liquid crystal capacitor Clcb may be rendered different from the voltage charged in the second liquid crystal capacitor Clcb. However, exemplary embodiments of the present invention are not limited thereto. Various methods may be used to make the voltage charged in the first liquid crystal capacitor Clcb different from the voltage charged in the second liquid crystal capacitor Clcb.

Figure 6:
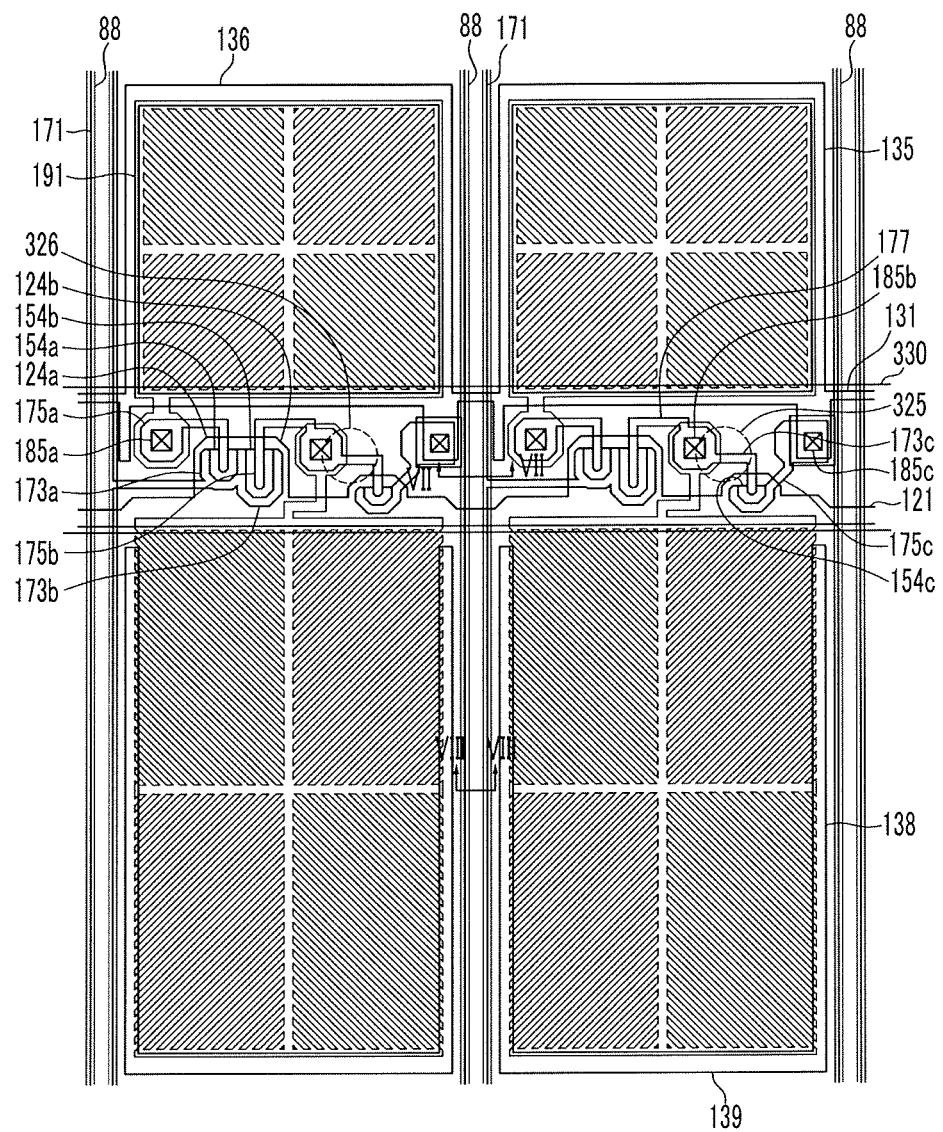
FIG. 6 is a layout view of two pixels of a liquid crystal display according to an exemplary embodiment of the present invention.
Figure 7:
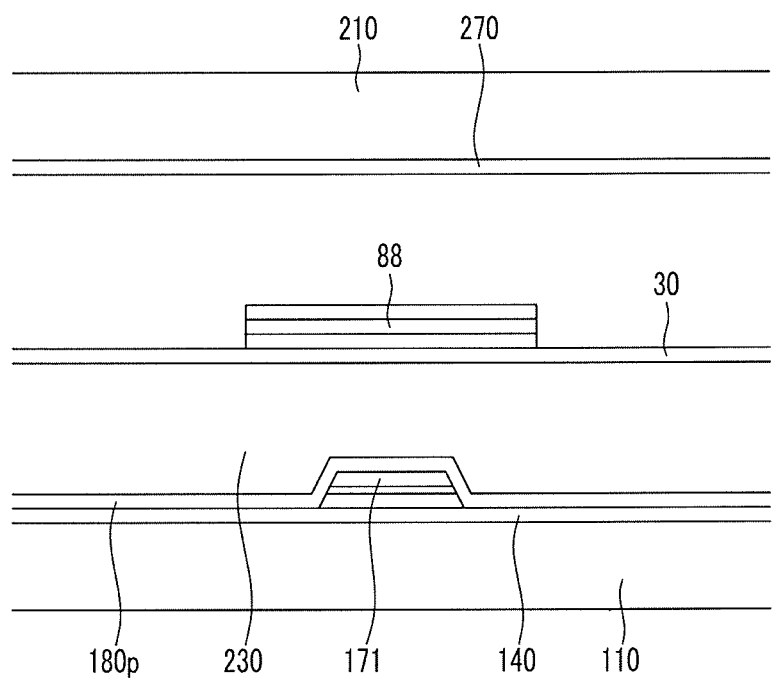
FIG. 7 is a cross-sectional view taken along line VII-VII of FIG. 6, according to an exemplary embodiment of the present invention.

FIG. 6 is a layout view of two pixel of a liquid crystal display according to an exemplary embodiment of the present invention. FIG. 7 is a cross-sectional view taken along line VII-VII of FIG. 6.

The liquid crystal display according to an exemplary embodiment includes a lower panel and an upper panel facing each other, a liquid crystal layer interposed between the two panels, and a pair of polarizers respectively attached to outer sides of the panels.

A gate conductor including a gate line 121 and a storage electrode line 131 is formed on an insulation substrate 110 made of transparent glass or plastic.

The gate line 121 includes a first gate electrode 124a, a second gate electrode 124b, a third gate electrode 124c, and a wide end portion for connection with another layer or an external driving circuit.

The storage electrode line 131 includes first storage electrodes 135 and 136 and a reference electrode. Second storage electrodes 138 and 139 are not connected to the storage electrode line 131 and overlap the second subpixel electrode. The second storage electrodes 138 and 139 may be connected to the first storage electrodes 135 and 136 of an underneath adjacent pixel.

A gate insulating layer 140 is formed on the gate line 121 and the storage electrode line 131.

A first semiconductor 154a, a second semiconductor 154b, and a third semiconductor 154c are positioned on the gate insulating layer 140.

A plurality of ohmic contacts is positioned on the semiconductors 154a, 154b, and 154c.

A data conductor including a plurality of data lines 171 including a first source electrode 173a and a second source electrode 173b, a first drain electrode 175a, a second drain electrode 175b, a third source electrode 173c, and a third drain electrode 175c is positioned on the ohmic contacts and the gate insulating layer 140.

The data conductor, the semiconductor positioned below the data conductor, and the ohmic contact may be substantially simultaneously formed using one mask.

The data line 171 includes a wide end portion for connection with another layer or an external driving circuit.

The first gate electrode 124a, the first source electrode 173a, and the first drain electrode 175a, together with the first semiconductor 154a, form a first thin film transistor (TFT) Qa, and a channel of the thin film transistor is formed in the semiconductor 154a between the first source electrode 173a and the first drain electrode 175a. The second gate electrode 124b, the second source electrode 173b, and the second drain electrode 175b, together with the second semiconductor 154b, form a second thin film transistor Qb, and a channel is formed in the semiconductor 154b between the second source electrode 173b and the second drain electrode 175b. The third gate electrode 124c, the third source electrode 173c, and the third drain electrode 175c, together with the third semiconductor 154c, form a third thin film transistor Qc, and a channel is formed in the semiconductor 154c between the third source electrode 173c and the third drain electrode 175c.

The second drain electrode 175b includes a wide extension 177 connected to the third source electrode 173c.

A first passivation layer 180p is positioned on the data conductors 171, 173c, 175a, 175b, and 175c and the exposed portion of the semiconductors 154a, 154b, and 154c. The first passivation layer 180p may include an inorganic insulating layer made of silicon nitride, silicon oxide, or the like. The first passivation layer 180p may prevent a pigment of the color filter 230 from flowing into the exposed portion of the semiconductors 154a, 154b, and 154c.

A color filter 230 is positioned on the first passivation layer 180p. The color filter 230 extends along two adjacent data lines.

A second passivation layer is formed on the color filter 230 and the first light blocking member 230.

The second passivation layer may include an inorganic insulating layer made of silicon nitride, silicon oxide, or the like. The second passivation layer prevents the color filter 230 from being lifted and the liquid crystal layer from being contaminated by an inflow of an organic material such as a solvent from the color filter 230.

The first passivation layer 180p and the second passivation layer have a first contact hole 185a and a second contact hole 185b exposing the first drain electrode 175a and the second drain electrode 175b.

In the first passivation layer 180p and the second passivation layer, and the gate insulating layer 140, a third contact hole 185c exposing a part of the reference electrode and a part of the third drain electrode 175c is positioned, and the third contact hole 185c is covered by a connecting member. The connecting member electrically connects the reference electrode and the third drain electrode 175c exposed by the third contact hole 185c.

A plurality of pixel electrodes 191 are positioned on the second passivation layer 180q. Each pixel electrode 191 includes a first subpixel electrode and a second subpixel electrode which are separated from each other with the gate line 121 positioned therebetween. The first and second subpixel electrodes are positioned adjacent to each other in a column direction. The pixel electrode 191 may be made of a transparent material such as ITO or IZO. The pixel electrode 191 may be made of a transparent conductive material such as ITO or IZO, or a reflective metal such as aluminum, silver, chromium, or an alloy thereof.

The first subpixel electrode and the second subpixel electrode are physically and electrically connected to the first drain electrode 175a and the second drain electrode 175b through the first contact hole 185a and the second contact hole 185b, respectively receiving data voltages from the first drain electrode 175a and the second drain electrode 175b. In this case, a part of the data voltage applied to the second drain electrode 175b is divided by the third source electrode 173c, and accordingly, a magnitude of the voltage applied to the first subpixel electrode is larger than a magnitude of the voltage applied to the second subpixel electrode.

The first subpixel electrode and the second subpixel electrode to which the data voltages are applied and a common electrode 270 of the upper panel generate an electric field, determining directions of the liquid crystal molecules of the liquid crystal layer 3 between the two electrodes. The luminance of light passing through the liquid crystal layer 3 varies according to the determined directions of the liquid crystal molecules.

The common electrode 270 is positioned on an insulation substrate 210. An upper alignment layer is positioned on the common electrode 270. The upper alignment layer may be a vertical alignment layer.

The liquid crystal layer has negative dielectric anisotropy, and the liquid crystal molecules of the liquid crystal layer are aligned so that long axes thereof are substantially perpendicular to the surfaces of the two panels in the absence of an electric field.

Referring to FIG. 7, in the liquid crystal display according to an exemplary embodiment of the present invention, a shielding electrode 88 is positioned on the data line 171. The shielding electrode 88 may receive a common voltage and may block electrical interference between the data line 171 and the pixel electrode 191 and between the data line 171 and the common electrode 270, and thus, a voltage distortion of the pixel electrode 191 and the signal delay of the data voltage transmitted by the data line 171 may be reduced.

The thin film transistor array panel according to an exemplary embodiment of the present invention includes the shielding electrode instead of the light blocking member, and thus, a light leakage of the front viewing angle may be prevented. A low reflection metal layer is used as the shielding electrode is used, and thus a deterioration of the contrast ratio may be reduced.

While this invention has been shown and described in connection with exemplary embodiments thereof, it is to be understood by those of ordinary skill in the art that various changes in form and detail may be made thereto without departing from the spirit and scope of the present invention as defined by the following claims.

What is claimed is:

1. A thin film transistor array panel, comprising:
a substrate;
a data line formed on the substrate
color filters covering at least a portion of the data line;

a shielding electrode formed on the color filters, the shielding electrode overlapping an entire surface of the data line distal from the substrate; and a pixel electrode formed on the color filters and separated from the shielding electrode wherein the color filters are of different colors and overlap each other on the data line, and wherein the shielding electrode includes a copper (Cu) layer, an indium zinc oxide (IZO) layer, and a titanium (Ti) layer that are formed one above another.

2. The thin film transistor array panel of claim 1, wherein a reflectivity of the shielding electrode is in a range from about 5 to about 10%.

3. The thin film transistor array panel of claim 1, wherein a thickness of the titanium layer is in a range from about 70 Å to about 200 Å.

4. The thin film transistor array panel of claim 1, wherein a thickness of the indium zinc oxide layer is in a range from about 400 Å to about 1000 Å.

5. The thin film transistor array panel of claim 1, wherein a thickness of the copper layer is in a range from about 500 Å to about 1000 Å.

6. A thin film transistor array panel, comprising:
a substrate;
a data line formed on the substrate
a color filter covering at least a portion of the data line;
a shielding electrode formed on the color filter, the shielding electrode overlapping the data line; and
a pixel electrode formed on the color filter and separated from the shielding electrode,
wherein the shielding electrode comprises a a first layer that includes a copper (Cu) layer, a second layer that includes zinc oxide (ZnO), gallium zinc oxide (GZO), zinc indium oxide (ZIO), or zinc aluminum oxide (ZAO), and a third layer that includes a titanium (Ti) layer, that are formed one above another.

7. A method of manufacturing a display panel, the method comprising:
sequentially depositing a copper layer on a substrate, an indium zinc oxide layer on the copper layer, and a titanium layer on the indium zinc oxide layer;
etching the deposited copper, indium zinc oxide, and titanium layers to form a shielding electrode;
forming a transparent conductive layer on the substrate including the shielding electrode; and
etching the transparent conductive layer to form a pixel electrode separated from the shielding electrode and to remove the transparent conductive layer formed on the shielding electrode.

8. The manufacturing method of claim 7, wherein a thickness of the copper layer is in a range from about 500 Å to about 1000 Å.

9. The manufacturing method of claim 7, wherein a thickness of the indium zinc oxide layer is in a range from about 400 Å to about 1000 Å.

10. The manufacturing method of claim 7, wherein a thickness of the titanium layer is in a range from about 70 Å to about 200 Å.

11. A method of manufacturing a display panel, the method comprising:
depositing a copper layer on a substrate;
depositing on the copper layer a transparent conductive material including zinc oxide (ZnO), gallium zinc oxide (GZO), zinc indium oxide (ZIO), or zinc aluminum oxide (ZAO),
depositing a titanium layer on the transparent conductive material;
etching the deposited layers to form a shielding electrode;
forming a transparent conductive layer on the substrate including the shielding electrode; and
etching the transparent conductive layer to form a pixel electrode separated from the shielding electrode and to remove the transparent conductive layer formed on the shielding electrode.

12. The manufacturing method of claim 11, wherein etching the shielding electrode includes using a titanium etchant or a copper etchant.

13. A display panel, comprising:
a substrate;
a data line formed on the substrate;
color filters covering at least a portion of the data line;
a shielding electrode formed on the color filters, the shielding electrode overlapping an entire surface of the data line distal from the substrate; and
a pixel electrode formed on the color filters and electrically separated from the shielding electrode,
wherein the color filters are of different colors and overlap each other on the data line, and
wherein the shielding electrode includes a copper (Cu) layer, an indium zinc oxide (IZO) layer, and a titanium (Ti) layer that are formed one above another.

14. The display panel of claim 13, wherein a common voltage is applied to the shielding electrode.

15. The display panel of claim 13, further comprising an overcoat layer between the color filter and the shielding electrode.

* * * * *